United States Patent
Totani et al.

(10) Patent No.: US 8,673,677 B2
(45) Date of Patent: Mar. 18, 2014

(54) METHOD FOR PRODUCING GROUP III NITRIDE SEMICONDUCTOR LIGHT EMITTING ELEMENT

(75) Inventors: Shingo Totani, Kiyosu (JP); Masashi Deguchi, Kiyosu (JP)

(73) Assignee: Toyoda Gosei Co., Ltd., Kiyosu-shi, Aichi-ken (JP)

( * ) Notice: Subject to any disclaimer, the term of this patent is extended or adjusted under 35 U.S.C. 154(b) by 0 days.

(21) Appl. No.: 13/421,717

(22) Filed: Mar. 15, 2012

(65) Prior Publication Data

US 2012/0244653 A1 Sep. 27, 2012

(30) Foreign Application Priority Data

Mar. 24, 2011 (JP) ................................ 2011-065360
Oct. 25, 2011 (JP) ................................ 2011-234347

(51) Int. Cl.
*H01L 21/00* (2006.01)

(52) U.S. Cl.
USPC ........... 438/72; 438/48; 438/57; 257/E33.025

(58) Field of Classification Search
USPC ................... 438/22–47; 257/79–103
See application file for complete search history.

(56) References Cited

U.S. PATENT DOCUMENTS

| | | | | |
|---|---|---|---|---|
| 5,696,389 A * | 12/1997 | Ishikawa et al. | ................. | 257/99 |
| 7,211,832 B2 * | 5/2007 | Hirose | ............................. | 257/98 |
| 7,211,833 B2 * | 5/2007 | Slater, Jr. | ......................... | 257/98 |
| 7,611,992 B2 * | 11/2009 | Tsunoda | ........................ | 438/704 |
| 7,615,792 B2 * | 11/2009 | Yokoyama et al. | ............. | 257/83 |
| 8,003,994 B2 * | 8/2011 | Liu et al. | .......................... | 257/79 |
| 8,017,956 B2 * | 9/2011 | Furuyama | ....................... | 257/89 |
| 8,373,193 B2 * | 2/2013 | Kim et al. | ........................ | 257/99 |
| 2003/0052328 A1 | 3/2003 | Uemura | | |
| 2005/0211989 A1 | 9/2005 | Horio et al. | | |
| 2009/0045431 A1 * | 2/2009 | Ueda et al. | ....................... | 257/99 |
| 2010/0051978 A1 * | 3/2010 | Katsuno et al. | .................. | 257/94 |
| 2010/0051987 A1 * | 3/2010 | Katsuno et al. | .................. | 257/98 |
| 2010/0219437 A1 * | 9/2010 | Usuda et al. | ..................... | 257/98 |
| 2011/0049541 A1 * | 3/2011 | Katsuno et al. | .................. | 257/94 |
| 2011/0049550 A1 * | 3/2011 | Katsuno et al. | .................. | 257/98 |
| 2011/0255294 A1 * | 10/2011 | Okabe et al. | ................... | 362/362 |

FOREIGN PATENT DOCUMENTS

| | | | |
|---|---|---|---|
| JP | 2003-168823 A | | 6/2003 |
| JP | 2005-302747 A | | 10/2005 |
| WO | WO2010073539 | * | 1/2010 |

* cited by examiner

*Primary Examiner* — Scott B Geyer
*Assistant Examiner* — Evren Seven
(74) *Attorney, Agent, or Firm* — McGinn IP Law Group, PLLC

(57) ABSTRACT

A reflective film including Ag of an Ag alloy is patterned in a uniform thickness without decreasing reflectivity. The reflective film is formed on the entire surface of a first insulating film by sputtering, vacuum deposition or the like, and a barrier metal film having a given pattern is formed on the reflective film by a lift-off method. The reflective film is wet etched using a silver etching liquid. The barrier metal film is not wet etched by the silver etching liquid, and therefore functions as a mask, and the reflective film in a region on which the barrier metal film has been formed remains not etched. As a result, the reflective film having a desired patter can uniformly be formed on the first insulating film.

20 Claims, 5 Drawing Sheets

METHOD FOR PRODUCING GROUP III NITRIDE SEMICONDUCTOR LIGHT EMITTING ELEMENT

BACKGROUND

1. Field of the Invention

The present invention relates to a method for producing a group III nitride semiconductor light emitting element having a reflective film including Ag or an Ag alloy provided in an insulating film.

2. Background Art

A group III nitride semiconductor light emitting element provided with a reflective film including Ag provided in an insulating film, or a flip-chip type group III nitride semiconductor light emitting element provided with a reflective electrode including Ag as a p-electrode is conventionally known. For example, Patent Document 1 discloses a group III nitride semiconductor light emitting element having a structure that a p-electrode and an n-electrode are provided on the same surface side, an area of from the p-electrode to the n-electrode is covered with an insulating film, and a reflective film is provided in the insulating film. Patent Document 2 discloses a group III nitride semiconductor light emitting element including a p-type layer, a reflective electrode formed on the p-type layer, and an insulating layer formed on the reflective electrode. Formation of those reflective film and reflective electrode requires patterning to a given area.

Patent Document 1: JP-A-2005-302747
Patent Document 2: JP-A-2003-168823

However, in a case that a lift-off method is used in the patterning of a reflective film and a reflective electrode, a resist film formed has an inversed taper shape. As a result, the reflective film or the reflective electrode on an area becoming a shadow of the resist film has a taper shape, and has a small thickness. Thus, uniform thickness cannot be achieved. This particularly becomes a problem when a reflective film or a reflective electrode includes a multilayer. In a method for patterning by wet etching, where a liquid remover having strong detergency is used in resist removal after patterning, a reflective film is etched. In resist removal by ashing. Ag flocculates by oxidation and reflectivity is decreased. For those reasons, a liquid remover having weak detergency must be used for resist removal. However, residue of the resist is increased, and this gives rise to the problem in adhesion to an insulating film formed on a reflective film.

SUMMARY

Accordingly, an object of the present invention is to provide a method for producing a group III nitride semiconductor light emitting element having a reflective film including Ag or an Ag alloy, wherein patterning of the reflective film is performed in a uniform film thickness without decreasing reflectivity.

A first invention is a method for producing a group III nitride semiconductor light emitting element having a reflective film including Ag or an Ag alloy, including a first step of forming a reflective film, a second step of patterning a barrier metal film including a material having resistance to wet etching on the reflective film, a third step of wet etching the reflective film using the barrier metal film as a mask, and a fourth step of forming an insulating film on the barrier metal film.

The reflective index may be an electrode, and may be sandwiched between insulting films. The reflective film may be a single layer, and may be a multilayer. To improve adhesion of the reflective film to the insulating film, a film of Ti or the like may be provided between the insulating film and the reflective film. The reflective film may be a film for reflecting light emitted to an electrode side to a growth substrate side in a flip-chip type element, and may be a film for reflecting light emitted toward an electrode lower part, thereby preventing the light from being absorbed in the electrode.

Dry ashing such as photo-excited ashing or oxygen plasma ashing is desirably conducted before forming an insulating film on a barrier metal film. This ashing can remove impurities and can improve adhesion between the barrier metal film and the insulating film. Because the barrier metal film is formed on the reflective film, even though dry ashing is conducted, the reflectivity of the reflective film is suppressed from being decreased.

The patterning of the barrier metal film in the second step can use an etching method such as a lift-off method or dry etching. The material of the barrier metal film can use Ti, Cr, an conductive oxide, and the like. The barrier metal film may be a single layer, and may be a multilayer. In the case of the multilayer, Ti or Cr is preferably formed on an uppermost layer on which the insulating layer is formed later. The barrier metal film has a thickness of preferably from 50 to 1,000 nm. Where the thickness exceeds 1,000 nm, it is difficult to cover the barrier metal film with the insulating layer, which is undesirable. Where the thickness is less than 50 nm, the barrier metal film does not have a film shape, and oxygen or ozone used in dry ashing permeates, which is undesirable. The thickness is more preferably from 400 to 1,000 nm.

The insulating film may be any material so long as it is an insulating material having translucency to wavelength of light emitted from a group III nitride semiconductor light emitting element, such as $SiO_2$, $Si_3N_4$, $Al_2O_3$ or $TiO_2$.

The wet etching is desirably conducted such that an edge face of a region of the reflective film (that is, a face becoming an outer periphery of a region of the reflective film in planar view) locates at the same position as an edge face of a region of the barrier metal film (that is, a face becoming an outer periphery of a region of the barrier metal film in planar view) (that is, the outer periphery of a region of the reflective film is consistent with the outer periphery of a region of the barrier metal film in planar view), or is inside than the edge face of the barrier metal film (in planar view, the outer periphery of a region of the reflective film is included in the outer periphery of a region of the barrier metal film). The reason for this is that the reflective film can be formed uniformly.

A second invention is the method for producing a group III nitride semiconductor light emitting element in the first invention, which further includes a step of conducting dry ashing after the third step and before the fourth step.

A third invention is the method for producing a group III nitride semiconductor light emitting element in the second invention, wherein the dry ashing is photo-excited ashing.

A fourth invention is the method for producing a group III nitride semiconductor light emitting element in the first to third inventions, wherein the patterning of the barrier metal film in the second step is conducted by a lift-off method.

A fifth invention is the method for producing a group III nitride semiconductor light emitting element in the first to fourth inventions, wherein the barrier metal film is Ti, Cr or a conductive oxide.

A sixth invention is the method for producing a group III nitride semiconductor light emitting element in the first to fifth inventions, wherein the barrier metal film has a multi-layer structure, and Ti or Cr constitutes an uppermost layer.

A seventh invention is the method for producing a group III nitride semiconductor light emitting element in the first to fourth inventions, wherein the barrier metal film has a multilayer structure, and includes a layer including Al or a conductive oxide.

An eighth invention is the method for producing a group III nitride semiconductor light emitting element in the first to seventh inventions, wherein the first step is a step of forming the reflective film on other insulating film. The other insulating film may be any material so long as it is an insulating material having translucency to wavelength of light emitted from the group III nitride semiconductor light emitting element, such as $SiO_2$, $Si_3N_4$, $Al_2O_3$ or $TiO_2$, similar to the insulating film. The insulating film and the other insulating material may be the same material and may be different materials.

A ninth invention is the method for producing a group III nitride semiconductor light emitting element in the first to eighth inventions, wherein the reflective film is a p-electrode formed on a p-type layer.

A tenth invention is the method for producing a group III nitride semiconductor light emitting element in the first to ninth inventions, wherein an edge face of the reflective film is the same position as or is inside an edge face of the barrier metal film.

According to the present invention, a reflective film including Ag or an Ag alloy can be patterned in a uniform thickness without impairing reflectivity. Furthermore, by forming the barrier metal film, reflectivity of the reflective film is not deceased even though dry ashing is conducted. Therefore, impurities can be removed by conducting dry ashing, thereby adhesion of the reflective film to the insulating film can further be improved.

DETAILED DESCRIPTION OF THE INVENTION

The present invention is described below by specific examples, but the invention is not construed as being limited thereto.

EXAMPLE 1

Figure 1:
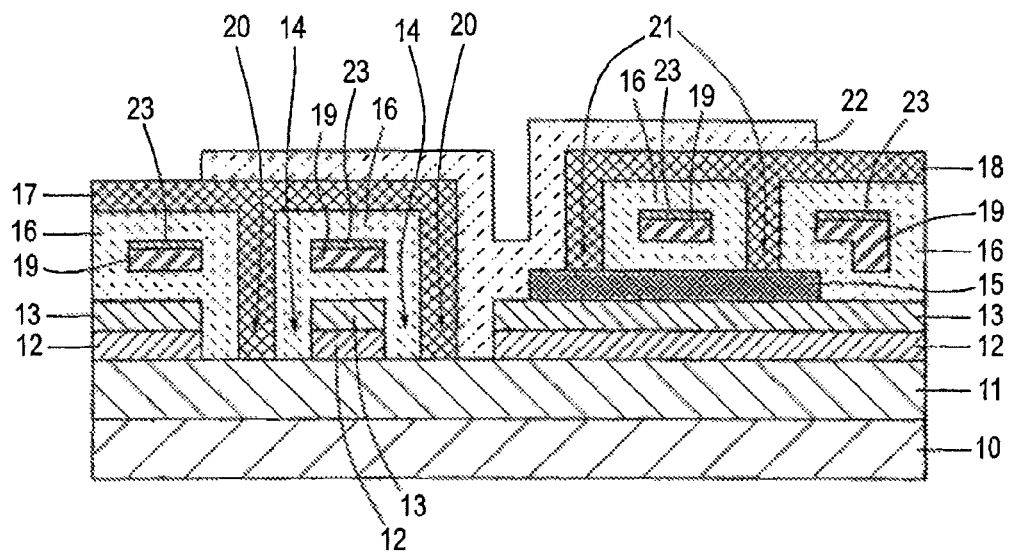
FIG. 1 is a cross-sectional view showing a constitution of the group III nitride semiconductor light emitting element of Example 1.
Figure 2:
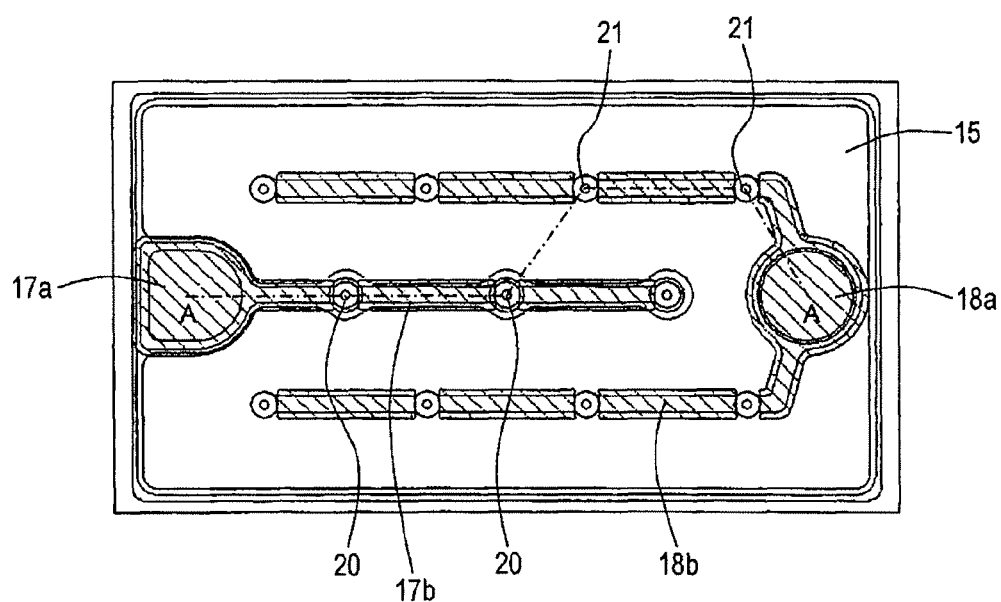
FIG. 2 is a plane view showing a constitution of the group III nitride semiconductor light emitting element of Example 1.

FIG. 2 is a plane view of the group III nitride semiconductor light emitting element of Example 1, and FIG. 1 is a cross-sectional view taken along A-A in the plane view.

As shown in FIG. 1, the group III nitride semiconductor light emitting element of Example 1 includes a sapphire substrate 10, and an n-type layer 11, a light emitting layer 12 and a p-type layer 13, formed on the sapphire substrate 10 in this order. The n-type layer 11 is constituted of, for example, an n-contact layer, an ESD layer and an n-clad layer in the order from a side of the sapphire layer 11. The light emitting layer 12 has, for example, an MQW structure, and has a structure including a well layer including InGaN, and a barrier layer including GaN, repeatedly laminated. The p-type layer 13 is constituted of, for example, a p-clad layer and a p-contact layer in the order from a side of the light emitting layer 12. A plurality of holes 14 having a depth reaching the n-type layer 11 from the surface of the p-type layer 13 (depth reaching the n-contact layer in the case that the n-type layer 11 has a laminate structure; hereinafter the same) is linearly provided at the central part of the surface of the p-type layer 11. An ITO electrode 15 is provided over nearly the entire surface of the p-type layer 13, except for a region on which holes 14 have been provided. An insulting film 16 including $SiO_2$ is continuously provided on a region on which the ITO electrode is not formed, of the surface of the ITO electrode 15, the side surface and the bottom of the hole 14, and the surface of the p-type layer 13. A material of the insulating layer 16 can use, other than $SiO_2$, an insulating material having translucency to a wavelength of light emitted from a group III nitride semiconductor light emitting element, such as $Si_3N_4$, $Al_2O_3$ or $TiO_2$.

An n-electrode 17 and a p-electrode 18 are formed on the insulating film 16. The n-electrode 17 is constituted of a pad part 17a to which a bonding wire is connected, and a wiring-like wire part 17b continuing to the pad part 17a, as shown in FIG. 2. Similarly, the p-electrode 18 is constituted of a pad part 18a, and a wiring-like wire part 18b continuing to the pad part 18a. A hole 20 exposing the n-type layer 11 which is a bottom of the hole 14, and a hole 21 exposing the ITO electrode 15 are provided in the insulating film 16. The wire part 17b of the n-electrode 17 is in contact with the n-type layer 11 through the hole 20, and the wire part 18b of the p-electrode 18 is in contact with the ITO electrode 15 through the hole 21.

A reflective film 19 is embedded in a region which is in the insulating film and faces the n-electrode 17 and the p-electrode 18 in planar view in the insulating film 16. The reflective film 19 has a three layer structure of Al/Ag/Al (the expression "/" means lamination, and A/B means a laminate structure that A is film-formed, and B is then film-formed; hereinafter the same) in the order from the side near the p-type layer (lower side)), Al has a thickness of from 1 to 30 angstroms. The reason that the reflective film 19 is not a single layer of Ag, but has a structure that an Ag layer is sandwiched between Al layers is that migration of Ag is prevented by sandwiching Ag with Al having ionization tendency larger than that of Ag. The material of the reflective film 19 may be a material other than Al/Ag/Al, and may be a single layer including Ag or an Ag alloy, or a composite layer containing a layer including Ag or an Ag alloy. A barrier metal film 23 is formed on the reflective film 19 in a state of contacting the reflective film 19.

A material of the barrier metal film 23 is a metal having resistance to wet etching of the reflective film 19 and having good adhesion to the insulating film 16, and is, for example, Ti or Cr.

In the above description, Ti or Cr is used in a form of a single layer as the barrier metal film 23, but the barrier metal layer 23 is not limited to a single layer, but may be a multilayer. The material of the barrier metal layer 23 may use a conductive oxide such as ITO (indium tin oxide), ICO (indium cerium oxide) or IZO (indium zinc oxide), other than Ti or Cr. When the conductive oxide is used as the barrier metal film 23, patterning of the barrier metal film 23 can be conducted by dry etching or wet etching. A multilayer barrier metal film 23 can use, for example, a laminate structure of Al/Ti/(Au, Pt or W)/(Ti or Cr). In this case, the patterning of the barrier metal film 23 can be conducted by lift-off. Furthermore, a laminate structure of (ITO, ICO or IZO)/Ti/(Au, Pt or W)/(Ti or Cr) can be used. In this case, the barrier metal film 23 can be formed as follows. First, the patterning is conducted by subjecting (ITO, ICO or IZO) to dry etching or wet etching. Next, a structure up to Ti (Au, Pt or W)/(Ti or Cr) is patterned on (ITO, ICO or IZO) using lift-off. That is, a resist film is patterned on a region other than a formation region of (ITO, ICO or IZO), a laminate structure of Ti(Au, Pt or W)/(Ti or Cr) is formed on the entire surfaces on the (ITO, ICO or IZO) and the resist film by vacuum deposition or sputtering, and thereafter the resist film and the laminate structure of Ti(Au, Pt or W)/(Ti or Cr) on the resist film are removed. A laminate structure of (ITO, ICO or IZO)/Ti/(Au. Pt or W)/(Ti or Cr) can be formed by the above procedures.

The barrier metal film 23 desirably has a thickness of from 50 to 1,000 nm. Where the thickness exceeds 1,000 nm, it becomes difficult to cover the barrier metal film 23 with the insulating film 16, which is undesirable. Where the thickness is less than 50 nm, the barrier metal film 23 does not become a film shape, and oxygen and ozone used in dry ashing permeate, which is undesirable. The thickness is more desirably from 400 to 1,000 nm.

The group III nitride semiconductor light emitting element of Example 1 is a face-up type element which extracts light from the n-electrode 17 and p-electrode 18 sides. The reflective film 19 embedded in the insulating film 16 is located at the lower part of the n-electrode 17 and p-electrode 18.

Therefore, of the light emitted from the light emitting layer 12, light going to the n-electrode 17 and the p-electrode 18 is reflected by the reflective film 19, and returns to the inside of the element. This prevents light from being absorbed by the n-electrode 17 and the p-electrode 18. As a result, light extraction efficiency is improved as compared with the case that the reflective film 19 is not provided.

Production process of the group III nitride semiconductor light emitting element of Example 1 is described below by reference to FIGS. 3 and 4.

The n-type layer 11, the light emitting layer 12, and the p-type layer 13 are formed in this order on the sapphire substrate 10 by an MOCVD process. Raw material gases use TMG (trimethyl gallium) as a Ga source, TMI (trimethyl indium) as an In source, TMA (trimethyl aluminum) as an Al source, ammonia as a nitrogen source, silane as an n-type doping gas, and cyclopentadienyl magnesium as a p-type doping gas. A carrier gas uses hydrogen or nitrogen. The ITO electrode 15 is formed on a part of a region on the p-type layer 13 by vacuum deposition (FIG. 3(a)).

Figure 3A:
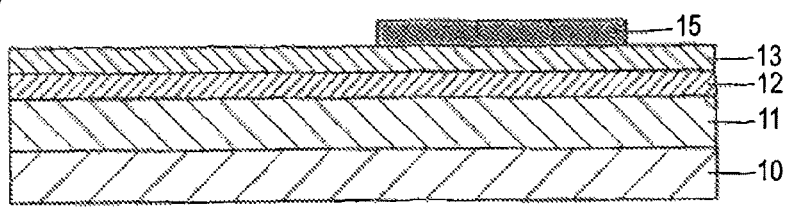
FIG. 3 is a view showing a production process of the group III nitride semiconductor light emitting element of Example 1.
Figure 3B:
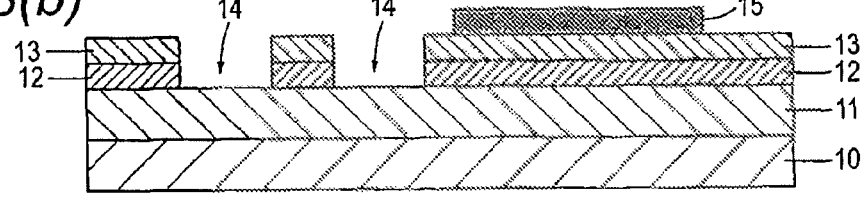
Figure 3C:
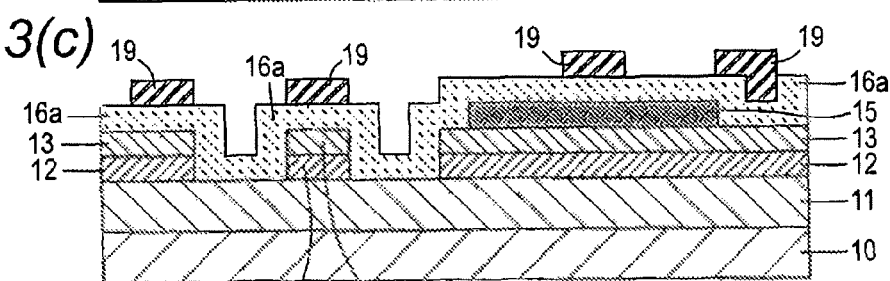
Figure 3D:
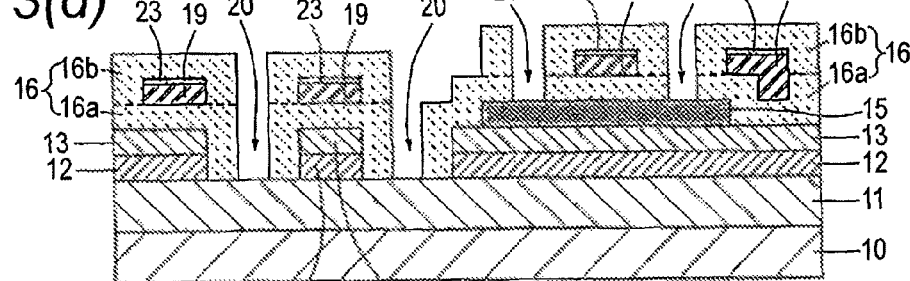
Figure 3E:
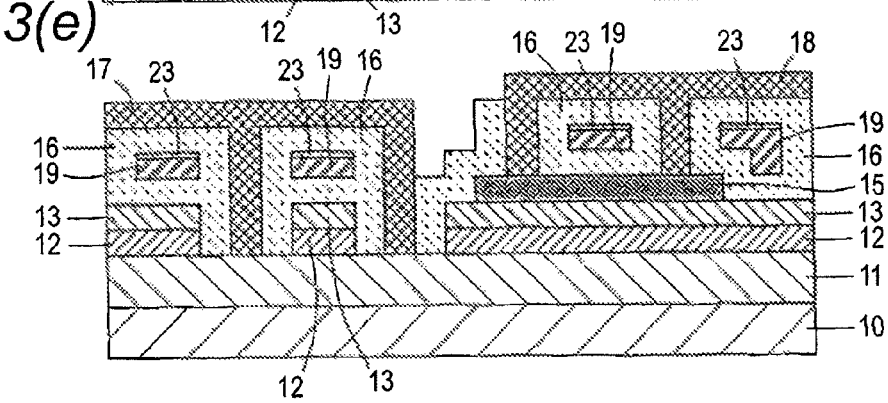

The hole 14 having a depth reaching the n-type layer 11 from the surface of the p-type layer 13 is formed by photolithography and dry etching (FIG. 3(b)).

The ITO electrode 15 may be formed after forming the hole 14.

A first insulating film 16a including $SiO_2$ (corresponding to "other insulating film" in claim 8) is continuously formed on the entire upper surface, that is, the surface of the ITO electrode 15, the bottom and the side surface of the hole 14, and a region which is the surface of the p-type layer 13, but on which the ITO electrode 15 is not formed, by a CVD process. An Al film, an Ag film and Al film are laminated in this order on a region which is on the first insulating film 16a and faces the n-electrode 17 and the p-electrode 18 formed later, in planar view, thereby forming the reflective film 19 including Al/Ag/Al (FIG. 3(c)). The Al film has a thickness of from 1 to 30 angstroms, and the Ag film has a thickness of from 500 to 5,000 angstroms.

Formation process of the reflective film 19 is described in further detail below by reference to FIG. 4.

Figure 4A:
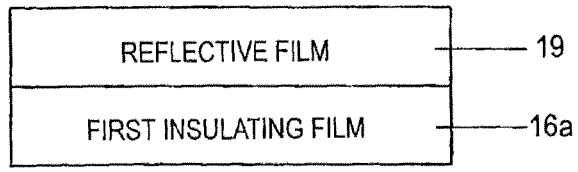
FIG. 4 is a view showing a formation process of a reflective film 19.

The reflective film 19 is formed on the entire surface of the first insulating film 16a by sputtering, vacuum deposition or the like (FIG. 4(a)).

Figure 4B:
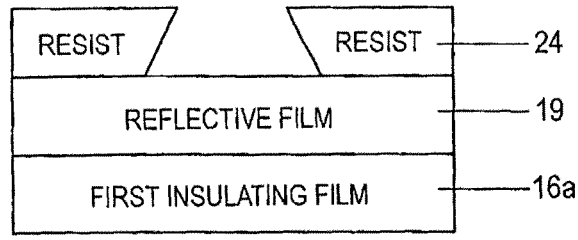

The resist film 24 is formed on a given region of the reflective film 19 by photolithography (FIG. 4(b)).

Figure 4C:
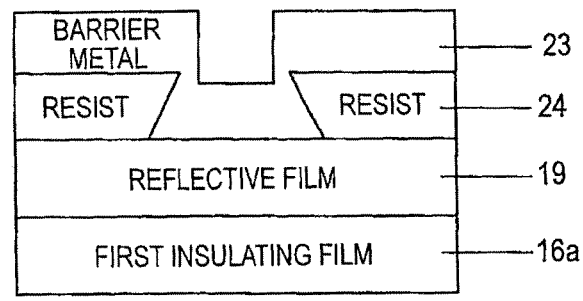

The barrier metal film 23 is continuously formed on the reflective film 19 and the resist film 24 by sputtering, vacuum deposition or the like (FIG. 4(c)).

Figure 4D:
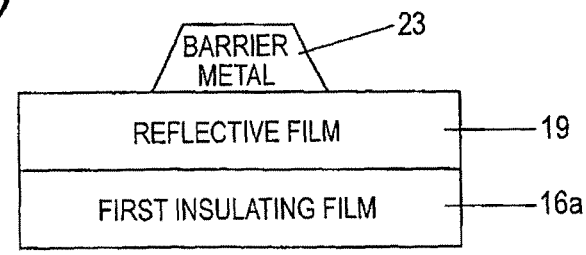
Figure 4E:
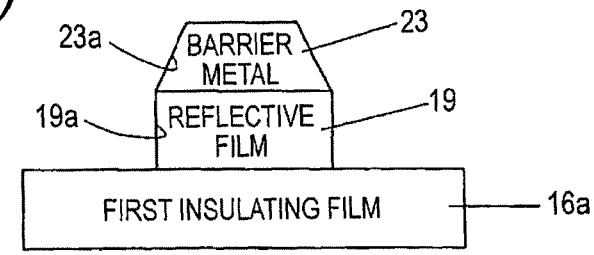

The resist film 24 is removed with a resist liquid remover, and additionally, the barrier metal film 23 formed on the resist film 24 is removed such that a part of the barrier metal film 23 remains on a given region (FIG. 4(d)).

A lift-off method is used in the patterning of the barrier metal film in steps of FIG. 4(b) to FIG. 4(d), but the barrier metal film 23 may be patterned by dry etching, wet etching or the like.

The reflective film 19 is wet etched with a silver etching liquid. The barrier metal film 23 is not wet etched by the silver etching liquid. Therefore, the barrier metal film 23 functions as a mask, and the reflective film 19 on a region having the barrier metal film 23 formed thereon remains not wet etched (FIG. 4(e)). As a result, the reflective film 19 having a desired pattern can be formed in a uniform thickness on the first insulating film 16a.

The wet etching is desirably conducted such that an edge face of a region of the reflective film 19 (that is, a face becoming an outer periphery of a region of the reflective film 19 in planar view) is located at the same position as an edge face of a region of the barrier metal film 23 (that is, a face becoming an outer periphery of a region of the barrier metal film 23 in planar view) (in planar view, the outer periphery of the region of the reflective film is consistent with the outer periphery of the region of the barrier metal film 23), or is located inside than the edge face of the region of the barrier metal film 23 (in planar view, the outer periphery of the region of the reflective film is included in the outer periphery of the region of the barrier metal film 23). The reason for this is that the reflective film 19 can be formed uniformly.

Photo-excited ashing is conducted to ash and remove organic impurities such as resist, remained on the surface of the barrier metal film 23. Because the barrier metal film 23 is formed on the reflective film 19, reflectivity of the reflective film 19 is suppressed from being decreased even though photo-excited ashing is conducted.

Figure 5:
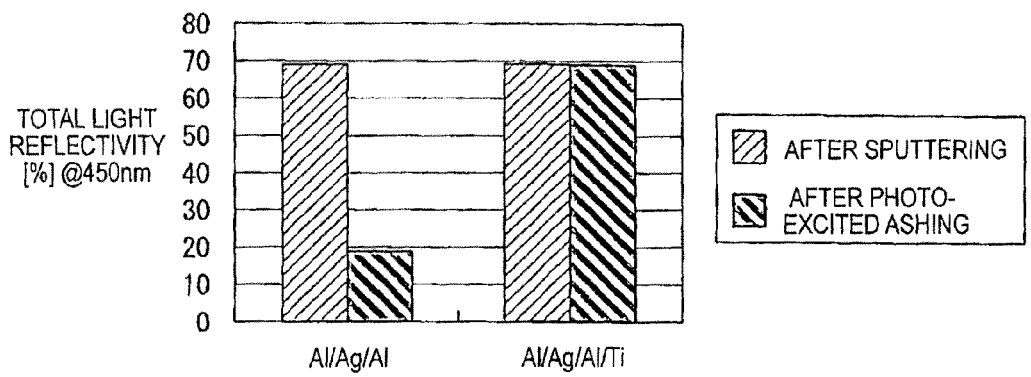
FIG. 5 is a graph showing change of reflectivity of the reflective film 19 by photo-excited ashing.

FIG. 5 is a graph showing reflectivity of the reflective film 19 before photo-excited ashing and after photo-excited ashing. A sample prepared as follows is used in the measurement of the reflectivity. GaN is formed on a sapphire substrate by an MOCVD process, ITO is formed on the GaN by vacuum deposition, $SiO_2$ is formed on the ITO by a CVD process, the reflective film 19 including Al/Ag/Al is formed on the $SiO_2$ by sputtering, and the barrier metal film 23 including Ti is formed on the reflective film 19 by vacuum deposition. Light having a wavelength of 450 nm is emitted vertically from the back of the sapphire substrate (a face opposite GaN formation side), and reflectivity is measured. For the sake of comparison, reflectivity of a sample without the formation of the barrier metal film 23 is measured. Each film thickness in the sample is that the sapphire substrate is 500 μm, GaN is 7 μm, ITO is 200 nm, $SiO_2$ is 300 nm, Al of the reflective film 19 is 2 nm, Ag thereof is 100 nm and the barrier metal film 23 is 50 nm.

As shown in FIG. 5, when photo-excited ashing is conducted without forming the barrier metal film 23, the reflectivity is greatly decreased from 69.0% to 18.7%. On the other hand, when the barrier metal film 23 is formed and photo-excited ashing is conducted, the change of the reflectivity is from 69.2% to 68.9%, and the reflectivity did not substantially change, Thus, the decrease in reflectivity by photo-excited ashing can be suppressed by providing the barrier metal film 23, and impurities can be removed by photo-excited ashing. As a result, adhesion of the reflective film 23 to a second insulating film 16b formed in the next step can further be increased.

Dry ashing other than photo-excited ashing may be used. For example, oxygen plasma ashing may be used.

The reflective film 19 having a uniform thickness can be formed without decreasing reflectivity on only a region facing the n-electrode 17 and the p-electrode 18 formed later in planar view (a region of orthogonal projection of the n-electrode 17 and the p-electrode 18) by the steps shown in FIG. 4.

The second insulating film 16b (corresponding to an "insulating film" in claim 1) including $SiO_2$ is continuously formed on the surface of the first insulating film 16a and the surface of the barrier metal film 23 by a CVD process. This step forms an integrated insulating film 16 of the first insulating film 16a and the second insulating film 16b, and the reflective film 19 and the barrier metal film 23 are formed so as to be embedded in a region which is in the insulating film 16 and faces the n-electrode 17 and the p-electrode 18 formed later in planar view. Impurities are removed by photo-excited ashing before forming the second insulating film 16b. Therefore, adhesion of the insulating film 16 to the reflective film 19 and the barrier metal film 23 is improved. The hole 20 exposing the n-type layer 11 and the hole 21 exposing the ITO electrode 15 are formed in a given region of the insulating film 16 (FIG. 3(d)). In Example 1, $SiO_2$ is used in the first insulating film 16a and the second insulating film 16b, thereby forming an integrated insulating film 16. However, different materials may be used in the first insulating film 16a and the second insulating film 16b. The first insulating film 16a and the second insulating film 16b can use insulating materials having translucency to a wavelength of light emitted from the group III nitride semiconductor light emitting element, such as $SiO_2$, $Si_3N_4$, $Al_2O_3$ or $TiO_2$.

The n-electrode 17 and the p-electrode 18, including Ni/Au/Al are formed on the insulating film 16 by vacuum deposition. The n-electrode 17 and the p-electrode 18 may be formed separately, and may be simultaneously formed using the same material. The n-electrode 17 is formed in a shape having a pad part 17a and a wiring-shaped wire part 17b, and is formed such that a part of the wire part 17b embeds the hole 20, and the wire part 17b contacts the n-type layer 11. The p-electrode 18 is formed in a shape having a pad part 18a and a wiring-shaped wire part 18b, and is formed such that a part of the wire part 18b embeds the hole 21, and the wire part 18b contacts the ITO electrode 15 (FIG. 3(e)).

Heat treatment is conducted at a temperature of from 300 to 700° C. for 3 minutes. The heat treatment is conducted for that the n-electrode 17 has ohmic contact with n-type layer 11, and further for that the p-electrode 18 has ohmic contact with the ITO electrode 15, and the ITO electrode 15 has ohmic contact with the p-type electrode 13. Thereafter, the insulating film 22 is formed on the entire surface excluding the pad part 17a of the n-electrode 17 and the pad part 18a of the p-electrode 18, thereby the group III nitride semiconductor light emitting element of Example 1 shown in FIGS. 1 and 2 is produced. The insulating film 22 can use insulating materials having translucency to a wavelength of light emitted from the group III nitride semiconductor light emitting element, such as $SiO_2$, $Si_3N_4$, $Al_2O_3$ or $TiO_2$.

EXAMPLE 2

Figure 6:
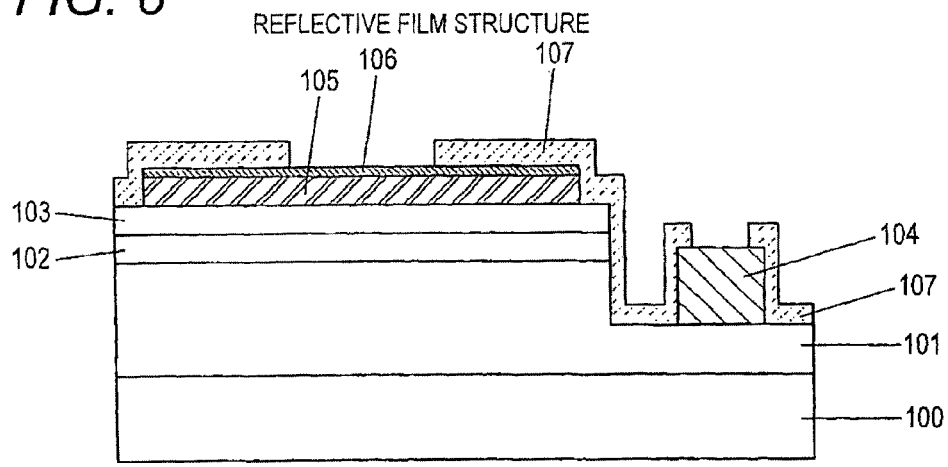
FIG. 6 is a cross-sectional view showing a constitution of the group III nitride semiconductor light emitting element of Example 2.

FIG. 6 shows a cross-sectional view showing a constitution of the group III nitride semiconductor light emitting element of Example 2. The group III nitride semiconductor light emitting element of Example 2 is a flip-chip type element, and includes a sapphire substrate 100 having laminated thereon an n-type layer 101, a light emitting layer 102 and a p-type layer 103 in this order through a buffer layer (not shown). A part of a region of the light emitting layer 102 and the p-type layer 103 is etched to form a groove, and the n-type layer 101 is exposed on the bottom of the groove. An n-electrode 104 is formed on the n-type layer 101 exposed on the groove bottom. A reflective electrode 105 including Ag is formed on nearly the entire surface of the p-type electrode 103. A barrier metal film 106 is formed on the reflective electrode 105. A part having an exposed surface is covered with an insulating film 107, except for a part of the surface of the reflective electrode 105 and a part of the surface of the n-electrode 104.

Figure 7A:
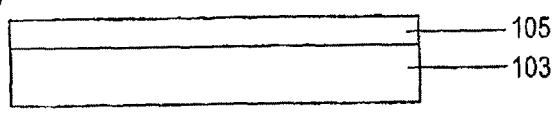
FIG. 7 is a view showing a formation process of a reflective electrode 105 of the group III nitride semiconductor light emitting element of Example 2.
Figure 7B:
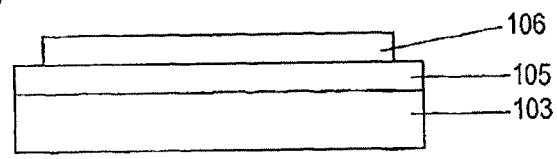
Figure 7C:
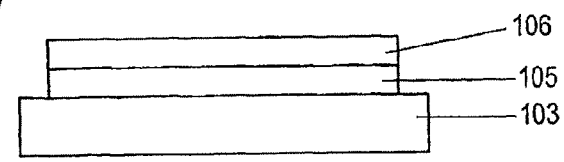

The reflective electrode 105 of the group III nitride semiconductor light emitting element of Example 2 is formed in the same manner as the reflective film 19 of Example 1. The reflective electrode 105 is formed on the entire surface of the p-type layer 103 by sputtering or vacuum deposition (FIG. 7(a)). The barrier metal film 106 is patterned on a given region of the reflective electrode 105 using a lift-off method (FIG. 7(b)). The reflective electrode 105 is wet etched using a silver etching liquid. The barrier metal film 106 is not wet etched by a liquid resist remover. Therefore, the barrier metal film 106 functions as a mask, and the reflective electrode 105 of a region on which the barrier metal film 106 has been formed remains without being wet etched (FIG. 7(c)). This step can form the reflective electrode 105 having a given pattern in uniform thickness on the p-type layer 103. Photo-excited ashing is conducted to remove impurities, thereby improving adhesion of the insulating film 107 formed later.

As described above, the formation method of the reflective electrode 105 of Example 2 can obtain the same effect as in the formation method of the reflective film 19 of Example 1. That is, the reflective electrode 105 can be patterned in uniform thickness without impairing reflectivity. Furthermore, by forming the barrier metal film 106, the reflectivity of the reflective electrode 105 is not decreased even though photo-excited ashing has been conducted. As a result, impurities can be removed by conducting photo-excited ashing, and adhesion of the reflective electrode 105 to the insulating film 107 can further be improved.

EXAMPLE 3

In the formation step of the reflective film 19 including Al/Ag/Al of Example 1 shown in FIG. 4, the Al film which is the outermost surface of the reflective film 19 is etched by a developer in the formation of the resist film 24 by photolithography of FIG. 4(b), and there is a possibility that the effect of suppressing migration of Ag by the Al film is impaired.

Therefore, Example 3 adds a step described below between the step of FIG. 4(a) and the step of FIG. 4(b) in the formation process of the reflective film 19 of Example 1 shown in FIG. 4.

After forming the reflective film 19 including Al/Ag/Al (a structure including an Al film 19a, an Ag film 19b and an Al film 19c laminated in the order from the first insulating film 16a side) by the step of FIG. 4(a), heat treatment is conducted in an oxygen atmosphere. The heat treatment oxidizes the surface of the Al film 19c (a surface at the side opposite the Ag film 19b side) and forms an oxide coating film 19d including aluminum oxide ($Al_2O_3$) (see FIG. 8).

Figure 9:
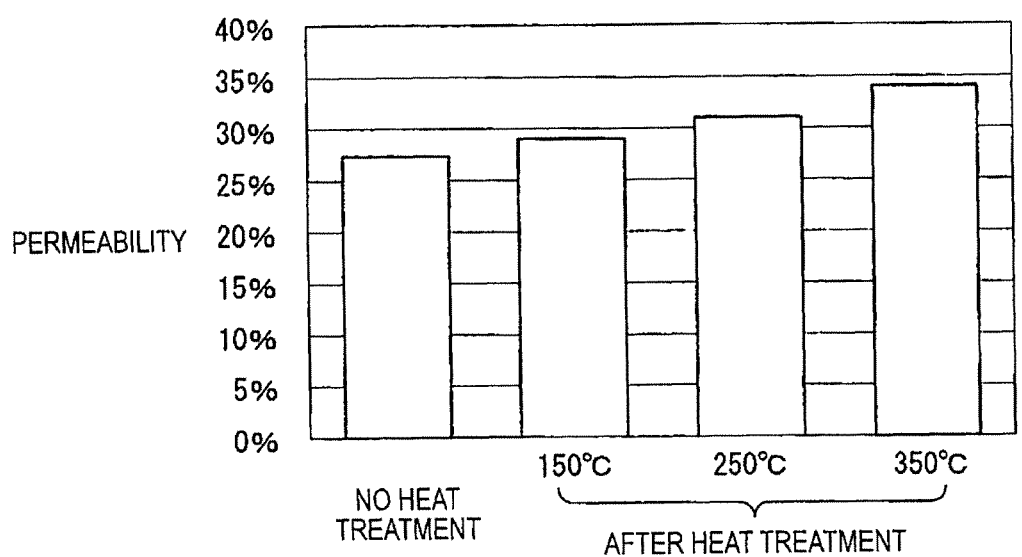
FIG. 9 is a view showing change of transmittance when an Al film is treated in an oxygen atmosphere.

FIG. 9 is a view showing permeability of an Al film after heat treatment in the case of heat treating a 10 nm Al film in an oxygen atmosphere. The permeability is an average value in the case that wavelength of light is from 440 to 470 nm. The heat treatment temperature is 150° C., 250° C. and 350° C., and the heat treatment time is 10 minutes. In the case that the heat treatment is not conducted, the permeability of the Al film is about 27%. The permeability of the Al film after the heat treatment is about 29% at the heat treatment temperature of 150° C., about 31% at 250° C., and about 34% at 350° C. It is seen that the permeability of the Al film after the heat treatment is higher than that of the Al film which is not heat treated. It is seen from this fact that an oxide coating film including aluminum oxide is formed on the surface of the Al film by heat treating the Al film in an oxygen atmosphere. Furthermore, it is considered that from the fact that the permeability is increased with increasing the heat treatment temperature, oxidation of the Al film advances with increasing the temperature, and thickness of the coating film is increased.

Thus, it is seen from the results of FIG. 9 that the oxide coating film 19d including aluminum oxide can be formed on the surface of the Al film 19c by conducting heat treatment in an oxygen atmosphere.

Figure 8:
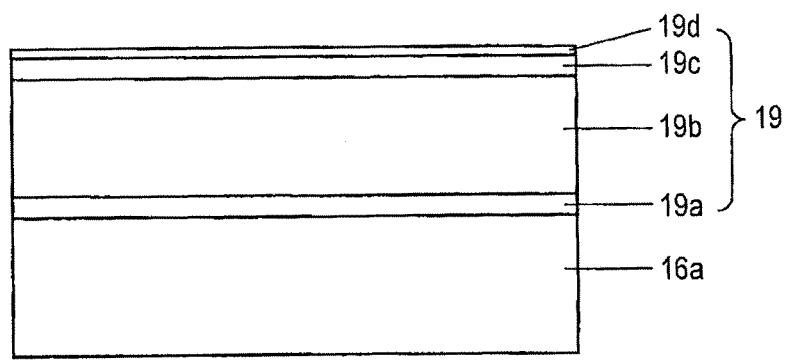
FIG. 8 is a view showing a formation process of the reflective film 19 of Example 3.

After the process of FIG. 8, the resist film 24 is formed on a given region of the reflective film 19 by photolithography as shown in FIG. 4(b). In this case, the outermost surface of the reflective film 19 is not the Al film 19c, but is the oxide coating film 19d including aluminum oxide. Aluminum oxide is not eroded by a developer at the time of photolithography, and therefore, etching of the Al film 19c is prevented.

As described above, according to the formation process of the reflective film 19 of Example 3, the Al film on the outermost surface can be prevented from being etched by a developer in forming the resist film 24 on the reflective film including Al/Ag/Al by photolithography, and the effect of suppressing migration of Ag by the Al film can be held.

Thickness of the oxide coating film 19d is sufficient to be one molecular layer or more, and is desirably that the Al film 19c remains in a thickness of 5 angstroms or more. Where the thickness of the Al film 19c is smaller than 5 angstroms, the effect of suppressing migration of Ag by the Al film 19c is not sufficiently exhibited, which is undesirable.

The heat treatment in the process of FIG. 8 is not required to be conducted in an atmosphere containing only oxygen, and may be conducted in an atmosphere containing oxygen to such an extent that the oxide coating film 19d can be formed on the Al film 19c.

In Example 3, a film having a structure of Al/Ag/Al is used as the reflective film, but the reflective film may have any structure so long as it is a structure including an Ag film and Al film formed on the surface thereof. For example, a film having a structure of Ag/Al may be used. Furthermore, other than Al, any material can be used so long as it is a material having ionization tendency larger than that of Ag and its oxide has resistance to a developer. For example, Ti, Cr and the like may be used.

An oxide film may be formed on the outermost surface of the Al film 19c by adding oxygen in the course of formation of the Al film 19c by sputtering or vacuum deposition in place of the formation of the oxide coating film 19d by the heat treatment in an oxygen atmosphere. Thickness of the oxide film is sufficient to be one molecular layer or more, and is desirably from one molecular layer to 100 nm. Where the thickness exceeds 100 nm, processability in the subsequent step is deteriorated, which is undesirable.

The group III nitride semiconductor light emitting element produced by the present invention can be utilized as light sources of illumination apparatuses and displays.

What is claimed is:

1. A method for producing a group III nitride semiconductor light emitting element including a reflective film, the method comprising:
   forming the reflective film comprising Ag or an Ag alloy;
   forming a metal barrier film comprising a material having resistance to wet etching on the reflective film;
   then patterning the metal barrier film;
   then wet etching the reflective film using only the patterned metal barrier film as a mask; and
   then forming an insulating film on the metal barrier film.

2. The method for producing a group III nitride semiconductor light emitting element according to claim 1, further comprising conducting dry ashing on the barrier film after the wet etching the reflective film and before the forming the insulating film.

3. The method for producing a group III nitride semiconductor light emitting element according to claim 2, wherein the dry ashing comprises photo-excited ashing.

4. The method for producing a group III nitride semiconductor light emitting element according to claim 1, wherein the patterning of the barrier film in the patterning the barrier film is conducted by a lift-off method.

5. The method for producing a group III nitride semiconductor light emitting element according to claim 1, wherein the barrier film comprises Ti, Cr or a conductive oxide.

6. The method for producing a group III nitride semiconductor light emitting element according to claim 1, wherein the barrier film comprises a multilayer structure, and Ti or Cr constitutes an uppermost layer of the barrier film away from the reflective film.

7. The method for producing a group III nitride semiconductor light emitting element according to claim 1, wherein the barrier film comprises a multilayer structure, and includes a layer comprising Al or a conductive oxide.

8. The method for producing a group III nitride semiconductor light emitting element according to claim 1, wherein the forming the reflective film comprises forming the reflective film on other insulating film.

9. The method for producing a group III nitride semiconductor light emitting element according to claim 1, wherein the reflective film comprises a p-electrode formed on a p-type layer.

10. The method for producing a group III nitride semiconductor light emitting element according to claim 1, wherein an edge face of the reflective film corresponds to or is inside an edge face of the barrier film.

11. The method for producing a group III nitride semiconductor light emitting element according to claim 1, further comprising forming an n-electrode and a p-electrode on the insulating film.

12. The method for producing a group III nitride semiconductor light emitting element according to claim 11, wherein the n-electrode is formed in a shape including a pad part and a wire part.

13. The method for producing a group III nitride semiconductor light emitting element according to claim 11, wherein the p-electrode is formed in a shape including a pad part and a wire part.

14. The method for producing a group III nitride semiconductor light emitting element according to claim 1, further comprising forming a resist film on a predetermined region of the reflective film.

15. The method for producing a group III nitride semiconductor light emitting element according to claim 14, wherein the patterning the barrier film comprises patterning the barrier film inside a region formed by the resist film.

16. The method for producing a group III nitride semiconductor light emitting element according to claim 15, further comprising removing the resist film such that the barrier film remains on a second predetermined region of the reflective film.

17. The method for producing a group III nitride semiconductor light emitting element according to claim 1, wherein the barrier film comprises a barrier metal film.

18. The method for producing a group III nitride semiconductor light emitting element according to claim 1, wherein the barrier film comprises a single layer of Cr.

19. The method for producing a group III nitride semiconductor light emitting element according to claim I, wherein a thickness of the barrier film is in a range from 50 nm to 1000 nm.

20. The method for producing a group III nitride semiconductor light emitting element according to claim 1, wherein a thickness of the barrier film is in a range from 400 nm to 1000 nm.

* * * * *